United States Patent [19]
Termerinac et al.

[11] Patent Number: 6,141,386
[45] Date of Patent: *Oct. 31, 2000

[54] ASYMMETRIC FILTER COMBINATION FOR A DIGITAL TRANSMISSION SYSTEM

[75] Inventors: Miodrag Termerinac, Hartheim; Franz-Otto Witte, Emmendingen, both of Germany

[73] Assignee: Micronas Intermetall GmbH, Freiburg, Germany

[ * ] Notice: This patent is subject to a terminal disclaimer.

[21] Appl. No.: 08/814,555

[22] Filed: Mar. 11, 1997

[30] Foreign Application Priority Data

Mar. 11, 1996 [EP] European Pat. Off. .............. 96103787

[51] Int. Cl.[7] .......................... H04L 27/04; H04L 27/12; H04L 27/20
[52] U.S. Cl. .................. 375/259; 375/285; 364/724.011
[58] Field of Search .................................... 375/229, 259, 375/285, 295, 296, 316, 346, 350; 364/724.011, 725.2, 725.014

[56] References Cited

U.S. PATENT DOCUMENTS

| | | | |
|---|---|---|---|
| 4,472,785 | 9/1984 | Kasuga | 364/718 |
| 4,879,726 | 11/1989 | Kobayashi et al. | 375/200 |
| 5,668,746 | 9/1997 | Iwaki et al. | 364/724.14 |
| 5,881,107 | 3/1999 | Termerinac et al. | 375/279 |

FOREIGN PATENT DOCUMENTS

| | | |
|---|---|---|
| 0263687 | 4/1988 | European Pat. Off. . |
| 0660321 | 6/1995 | European Pat. Off. . |

*Primary Examiner*—Chi H. Pham
*Assistant Examiner*—Bryan Webster
*Attorney, Agent, or Firm*—Arthur L. Plevy; Buchanan Ingersoll

[57] ABSTRACT

An asymmetric filter combination (F1, F2) for the transmission of a binary data stream (st) between a transmitter (T) and a receiver (R) is disclosed which includes a first filter (F1) at the transmitter end having an FIR structure and a second filter (F2) at the receiver end having an IIR structure, with the combination of the first and second filters (F1, F2) yielding a common transfer function which satisfies both the Nyquist criterion and the noise-matching criterion.

7 Claims, 3 Drawing Sheets

ASYMMETRIC FILTER COMBINATION FOR A DIGITAL TRANSMISSION SYSTEM

The present invention relates to an asymmetric filter combination for transmitting a binary data stream over a digital transmission link which interconnects a transmitter and at least one receiver. The digitally transmitted information may consist of arbitrary signals, i.e., video, audio, or other signals. The respective data rate fs or symbol rate fsymb is dependent on the signal content, of course. If several bits of the data stream are combined into a new value, the term "symbol" is used. The transmitted information, e.g., for a digital broadcasting system, ultimately consists of a bit sequence which is represented by the binary values 0 and 1 and which is modulated onto a carrier using a suitable modulation technique. The necessary transmission bandwidth defines a channel.

Theoretically, the spectrum of an idealized binary sequence is infinitely wide if the pulse edges are assumed to be infinitely steep. Such an infinite spectrum is neither real nor can it be processed or transmitted over a bounded channel. In order not to make the bandwidths of the channel and the associated modulating and demodulating facilities unnecessarily wide, it is necessary to limit the bandwidth of the binary pulse sequence prior to the modulation using pulse-shaping filters. The pulse-shaping filters should meet certain requirements known from signal transmission theory. An essential criterion is the Nyquist criterion for eliminating interferences between adjacent data or symbols. It is satisfied if the associated transfer function has the value 0 at all multiples of the sampling or symbol clock period, cf., for example, FIG. 4. Another important criterion is the so-called noise-matching condition, which is satisfied by matched filters. Filter combinations which satisfy this criterion suppress noise superposed on the signal between these filters, i.e., on the transmission channel, to a maximum extent. A further criterion is sufficient signal attenuation in the stopband. In the application of a data transmission system described herein, the pulse-shaping filter is separated into two components, one of which is placed at the data source, i.e., in the transmitter, and the other of which is placed at the data sink, i.e., in the receiver.

The modulation used for the data sequence to be transmitted may be any digital type, such as phase modulation, quadrature amplitude modulation, frequency modulation, or any other modulation. As a rule, the data sequence is converted, directly or in coded form, to a radio-frequency band for transmission. At the receiver end, a corresponding conversion to the baseband takes place, and the original data sequence is restored by suitable decoding devices, cf. FIG. 1.

In conventional digital transmission systems, the complexity of the pulse-shaping filters at the transmitter and receiver ends is the same. This is appropriate for bidirectional transmission links, but in broadcast transmission systems the complexity at the receiver end should be kept to a minimum while increased complexity should be provided at the receiver end.

It is, therefore, the object of the invention to reduce the complexity of the filter circuitry in the demodulator of the receiver and to provide the associated filter for the modulator in the transmitter, with the above-described criteria for pulse-shaping filters being satisfied. In addition, the pulse-shaping filters disclosed are to permit a digital implementation.

The object is attained, according to the wording of claim 1, by a filter combination as follows:

an asymmetric filter combination for the transmission of a binary data stream between a transmitter and a receiver, comprising:

a first filter at the transmitter end having an FIR structure; and a second filter at the receiver end having an IIR structure, with the combination of the first and second filters yielding a common transfer function $H_g(z)=H_t(z) \times H_r(z)$ which satisfies both the Nyquist criterion $H_g(z)+H_g(-z^*)=1$ and the noise-matching criterion $H_t(z)=H_r(z^*)$.

The approach taken to attain the object starts from a complexity-reduced implementation of the receiver filter, and the associated filter at the transmitter end is then adapted to the transfer characteristics of the receiver filter. By the use of all-pass filters, the amount of filter circuitry required at the receiver end is substantially reduced in comparison with the use of FIR filters, such as "raised-cosine" or Gaussian filters. Unfortunately the conjugate-complex filter at the transmitter end cannot be implemented with all-pass networks, since the latter are not realizable with the required properties in a stable or causal form. Using an FIR approximation, however, it is readily possible to design a transmitter filter which meets the requirements with arbitrary accuracy, with the amount of filter circuitry having to be increased only insignificantly in comparison with that required for conventional FIR filters. The design of this filter is based on the mirrored and delayed impulse response of the receiver filter and can thus be easily determined.

For the receiver end, simple filter structures can be provided which contain essentially two parallel-connected all-pass networks from whose outputs a difference is formed. Each of the all-pass networks can be implemented with a small amount of circuitry, since it only requires one multiplier, three adder-subtracters, and a delay unit which provides a delay equal to two clock periods.

The invention and advantageous features thereof will now be explained in more detail with reference to the accompanying drawings, in which.

Figure 1:
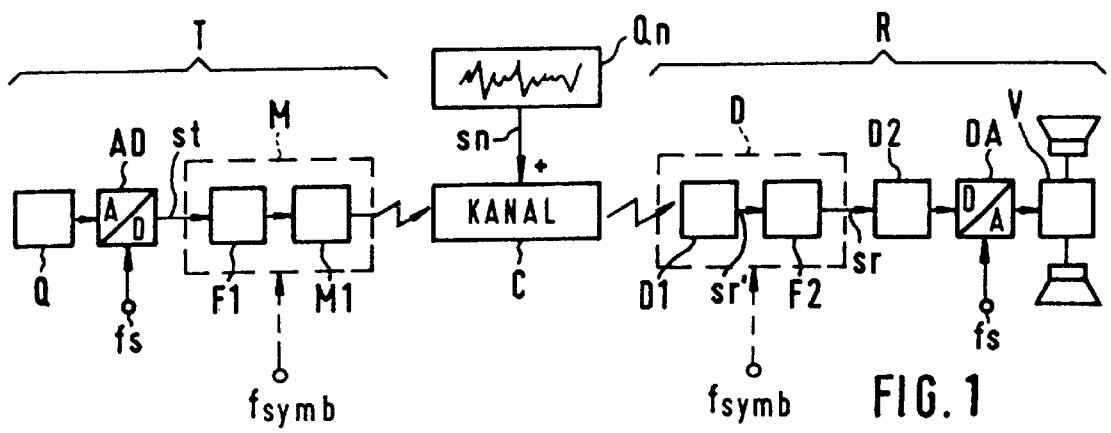
FIG. 1 is a block diagram showing the essential functional units of a digital transmission system which may be equipped with an asymmetric filter combination according to the invention.

FIG. 1 shows a digital transmission system with a transmitter T and a receiver R in a block diagram. The transmitter and the receiver are linked by a transmission channel C, on which an interfering signal sn from an arbitrary interference source Qn is superposed. The transmitter T includes a signal source Q, whose output is converted by means of an analog-to-digital convertr AD to a binary data stream st of the data rate fs, which is fed to a modulator M. Before the modulating device proper, which also effects the radio-frequency conversion, the binary data stream st is filtered by means of a first filter F1, which serves as a pulse-shaping filter in the transmitter T.

At the receiver end, the incoming radio-frequency signal is converted back to the baseband or a low-frequency band in a demodulator D. The radio-frequency conversion proper takes place in a demodulating device D1, whose output provides a digital data stream sr', which is filtered by means of a second filter F2. The first and second filters F1, F2 interact as an optimum pulse-shaping filter which satisfies both the Nyquist criterion and the noise-matching criterion. The pulse-shaping filter also provides the required stopband attenuation, of course. The respective coding technique and/or modulation technique used in the modulator M are unessential for the invention if the transmission in the channel C represents a bit sequence. The bit sequence in the channel C may, of course, differ from the bit sequence of the binary data stream st; this depends on the respective coding procedure used and on an increase in redundancy introduced by the coding. If some bits of the binary data stream st are combined into a single value, a "symbol" data stream with the symbol frequency fsymb≦fs will be transmitted. In the simplest case, the output of the demodulator D will provide a binary data stream sr which is equal to the binary data stream st at the transmitter end, and which is further processed in an arbitrary manner by means of a digital signal-processing device D2. The output of the latter is converted, by means of a digital-to-analog converter DA operated at the sampling rate fs, into one or more analog signals which are fed to an amplifier V that is coupled to, for example, two loudspeakers for stereo reproduction.

Figure 2:
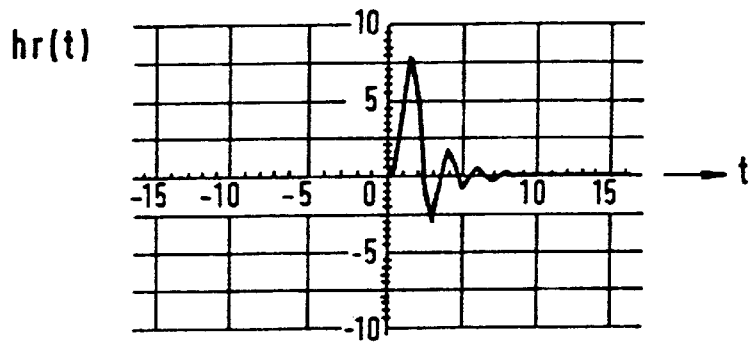
FIG. 2 shows an example of the transfer function of the receiver filter according to the invention.
Figure 3:
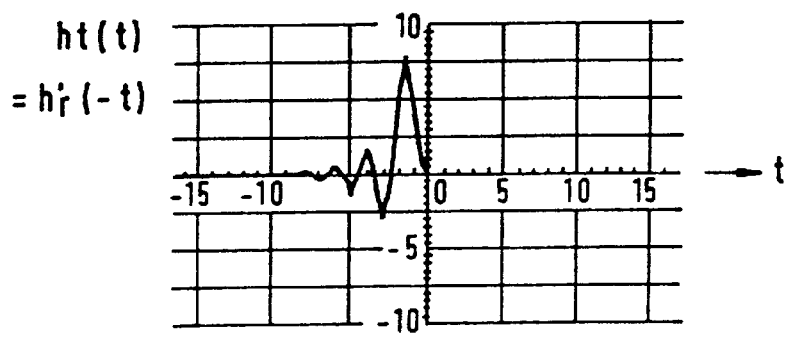
FIG. 3 shows the transfer function of the associated transmitter filter according to the invention.
Figure 4:
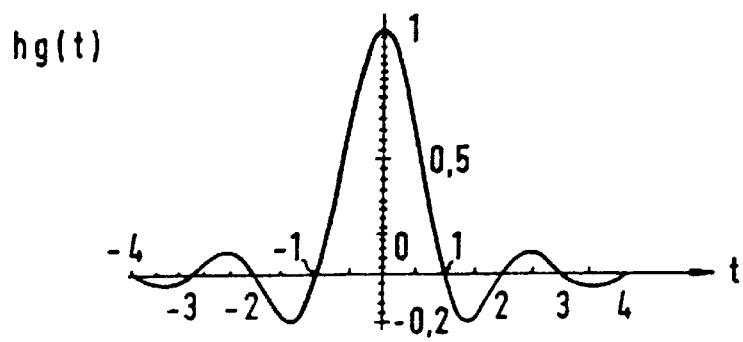
FIG. 4 shows the convoluted transfer function of the transmitter and receiver filters.

The schematic representation of FIG. 1 can be implemented both with a symmetric filter combination and, to advantage, with an asymmetric filter combination F1, F2 according to the invention. Examples of the impulse response h(t) of an asymmetric filter combination F1, F2 are given in FIG. 2 for the transmitter filter F1 and in FIG. 3 for the receiver filter F2. The two waveforms are mirror-symmetric with respect to the time axis t=0. The impulse response of FIG. 3, which extends into the negative time range, can be implemented by suitably predelaying the impulse responses of FIGS. 2 and 3 without violating the law of causality. The interaction of the two asymmetric filters F1, F2 is represented in FIG. 4 by the common impulse response hg(t), which is obtained by convolution of the impulse responses of FIGS. 2 and 3.

For the further considerations it is necessary to discuss the Nyquist criterion and the noise-matching criterion in more detail by examining the complex transfer functions H(z). In the following formulas, indexing in the usual form is used only if otherwise misunderstandings could result. The filter combination F1, F2 has a common transfer function Hg(z) which is divided into a transfer function Ht(z) for the transmitter filter F1 and a transfer function Hr(z) for the receiver filter F2. Convolution of the transfer functions of the two filters F1, F2 gives the transfer function Hg(z) for the filter combination F1, F2:

$$Hg(z)=Ht(z)\times Hr(z) \qquad \text{Eq. (1)}$$

For the further considerations it is assumed that the sampling frequency fs, which is determined by, for example, the analog-to-digital converter AD, is equal to twice the symbol rate fs=2×fsymb. The symbol rate is lower than the sampling frequency and follows from the combination of M bits of the primary data stream st into a single symbol value which is ultimately transmitted in some coded form and determines the symbol frequency/symbol rate on the transmission link C.

Assuming that $$fs=2\times fsymb, \qquad \text{Eq. (2)}$$

the implementation of the pulse-shaping filters in the receiver and the formulation of the criteria to be satisfied becomes particularly simple, as shown in the following. The Nyquist criterion then has the following general form:

$$Hg(z)+Hg(-z^*)=1 \qquad \text{Eq. (3)}$$

where $z=\text{Exp}(j\times 2\pi\times f/f_s)$. Instead of the sampling frequency fs, the symbol frequency fsymb may be used for frequency normalization.

For optimum noise matching, the following relation must hold between the transmitter filter F1 and the receiver filter F2:

$$Ht(z)=Hr(z^*) \qquad \text{Eq. (4)}$$

Furthermore, to suppress adjacent-channel interference, a sufficient attenuation $a_{min}$ is required in the respective stopband of F1, F2. The beginning of the stopband is commonly defined with the aid of the roll-off factor r:

$$|Ht(\text{Exp}(j\times 2\pi\times f/f_s))|\leq a_{min} \text{ with } f\geq 0.5\times fsymb\times(1+r) \qquad \text{Eq. (5)}$$

$$|Hr(\text{Exp}(j\times 2\pi\times f/f_s))|\leq a_{min} \text{ with } f\geq 0.5\times fsymb\times(1+r) \qquad \text{Eq. (6)}$$

These conditions, as stated above, are satisfied by "raised-cosine" and Gaussian filters, which are widely used as pulse-shaping filters. A disadvantage of these filter structures, however, is the considerable amount of circuitry required at the transmitter and receiver ends.

The invention is predicated on recognition that a receiver-filter structure with two parallel-connected all-pass networks A1, A2 can also satisfy the criteria of Equations (2), (3), (5), and (6). The associated complex transfer function has the form $$Hr(z)=\tfrac{1}{2}\times(A1(z)+z\times A2(z)) \qquad \text{Eq. (7)}$$

The complex transfer function of the two all-pass filters A1, A2 has the form $$H_{all\text{-}pass}(z) = A_i(z) \qquad \text{Eq. (8)}$$
$$= (a_m + a_{m-1}\times z^{-1} + \ldots + z^{-m})/$$
$$(1 + a_1\times z^{-1} + \ldots + a_m\times z^{-m})$$

If Equation (8) is referred to the inverted variable $z^*=1/z$ rather than the variable z, the following transformation results:

$$A_i(z^*)=1/A_i(1/z) \qquad \text{Eq. (8A)}$$

As can be shown, a filter combination F1, F2 which is implemented using all-pass networks both in the receiver filter F2 and in the corresponding transmitter filter F1 theoretically satisfies the Nyquist condition.

Starting from Equation (7), the transfer function Ht(z) of the transmitter filter F1 is formed from the transfer function Hr(z) of the receiver filter F2 via the noise-matching condition of Equation (4):

$$Ht(z)=\tfrac{1}{2}\times(1/A1(z^2)+z/A2(z^2)) \qquad \text{Eq. (8b)}$$

The common transfer function Hg(z) of this filter combination F1, F2 using all-pass networks results from the convolution of the individual transfer functions according to Equation (7) and Equation (8b):

$$Hg(z) = \frac{1}{2} \times (A1(z^2) + z^{-1} \times A2(z^2)) \times \frac{1}{2} \times (1/A1(z^2) + z/A2(z^2)) \quad \text{Eq. (9)}$$

The convolution, to be performed via a complex multiplication of the two transfer functions Hr(z) and Ht(z), yields the following equation:

$$Hg(z) = \frac{1}{2} + \frac{1}{4} \times (z \times A1(z^2)/A2(z^2)) + z^{-1} \times A2(z^2)/A1(z^2)) \quad \text{Eq. (10)}$$

Applying the Nyquist criterion from Equation (3) formally to Equation (10), which involves in particular forming the transfer function Hg(-z*), gives $$Hg(z) + Hg(-z^*) = 1 + 0 \quad \text{Eq. (11)}$$

Although Equation (11) is derived via the transfer functions of filters with all-pass networks, it looks the same as Equation (3), the general form of the Nyquist criterion. Unfortunately the conjugate-complex filter according to Equation (4) is unstable and is not causally realizable in this form using all-pass networks. Through the inversion of the receiver filter F2, which is assumed to be stable, poles and zeros are interchanged, whereby the poles of the transmitter filter F1 are moved to the complex frequency domain outside the unit circle. This, however, applies only to a mathematically exact IIR implementation of the transmitter filter. By an FIR approximation, however, it is readily possible to design a transmitter filter which satisfies the required conditions with an accuracy limited only by the amount of filter circuitry required. The design of this filter, as mentioned above, is based on the mirrored and delayed impulse response hr'(-t)=ht(t) of the receiver filter F2 according to FIGS. 2 and 3.

Figure 5:
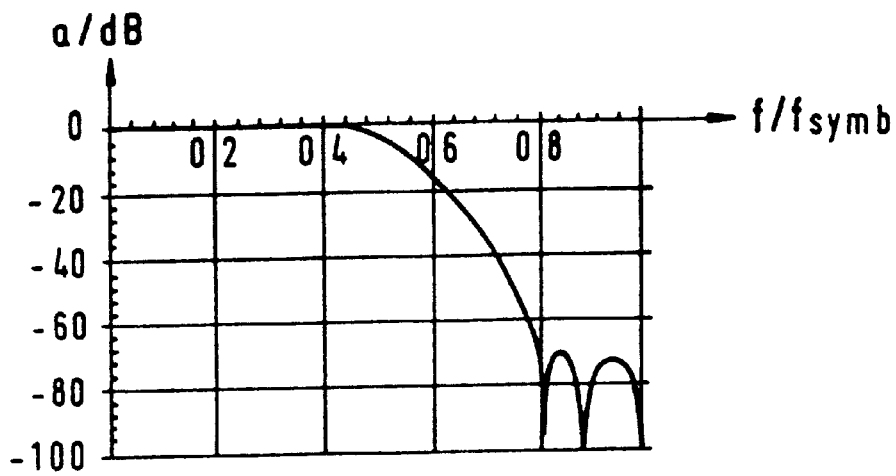
FIG. 5 shows the attenuation characteristic of the receiver filter and the associated ideal transmitter filter.

FIG. 5 shows, by way of example, the attenuation characteristic of a receiver filter F2 using all-pass networks. The frequency f has been normalized to the symbol frequency fsymb. In the stopband, the attenuation a is approximately −70 dB. The conjugate-complex receiver filter, cf. Equation (8b), theoretically has to have the same attenuation characteristic. However, since, as stated above, an all-pass implementation is not possible there, an FIR filter structure with which the frequency response to be mirrored, hr(t), is approximated as closely as possible by the frequency response ht(t) of FIG. 3 is used for the transmitter filter F1. The impulse response, which theoretically extends infinitely far into the negative time range, must be replaced by a time window which defines the beginning of the impulse response. This is fully justified if the clipped impulse response represents only an insignificant contribution.

If necessary, the time window and the associated FIR filter structure must be further enlarged until the suppressed contribution becomes negligible. An estimate shows that with the invention, the amount of circuitry required in the hitherto used FIR filters F1 needs to be increased by only 10 to 20%. At the receiver end, however, the saving is dramatic, since the comparable amount of filter circuitry required there is reduced by a factor of 10, for example.

Figure 6:
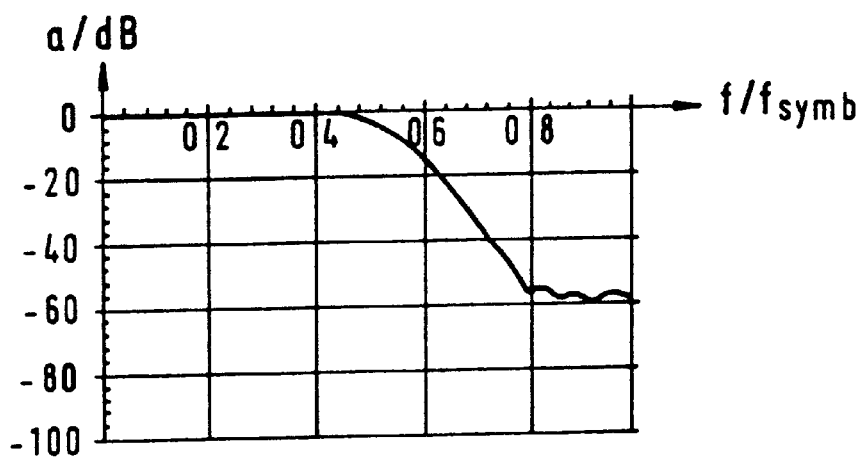
FIG. 6 shows the attenuation characteristic of the real transmitter filter.

The influence of the FIR filter, which represents an approximation, on the signal transmission properties manifests itself essentially only in the stopband attenuation, which is approximately −55 dB in the example assumed in FIG. 6, a value which is more than sufficient for the desired attenuation characteristic.

Figure 7:
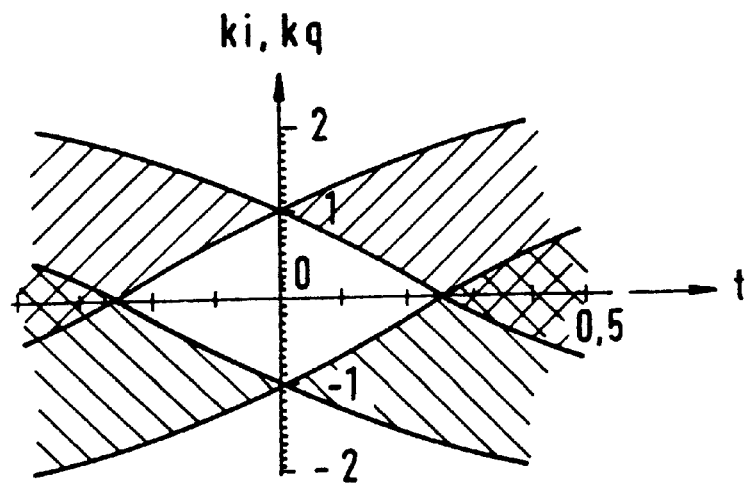
FIG. 7 shows the limit curves of the binary data stream in the receiver in a schematic eye diagram.

FIG. 7 shows schematically for a QPSK modulation the eye diagram of the in-phase or quadrature data stream sr at the receiver end. The curves passing through the signal values sr=+1 and sr=−1 represent limit curves between which the receive-side binary signal sr may be located, regardless of whether a symbol transition is just occurring or not. Since these limit curves intersect exactly at the values +1 and −1, it is apparent that the sequence of preceding symbols may be arbitrary and has no effect whatsoever on the symbol state sr to be determined at the instant t=0. The eye diagram of FIG. 7 is determined by computation from an asymmetric filter combination F1, F2 whose attenuation characteristic corresponds to FIGS. 5 and 6.

Figure 8:
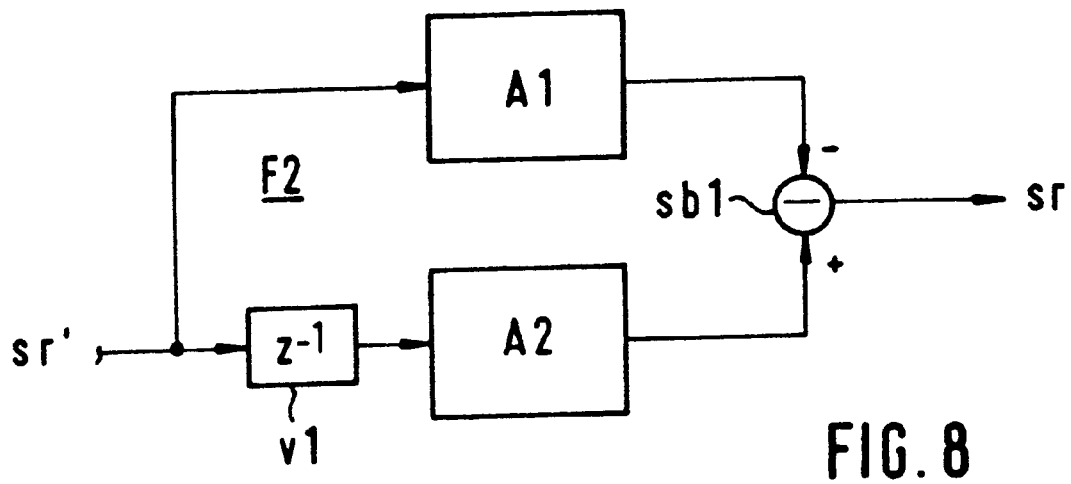
FIG. 8 shows an IIR filter structure.

FIG. 8 shows the structure of the receiver filter F2 with two all-pass networks A1, A2 in a block diagram. The structure shows a first signal path with the all-pass network A1 and a second signal path with a series combination of a $z^{-1}$ delay element v1 and the second all-pass network A2. The common input of the two signal paths is fed with a digital input signal sr'. The outputs of the first and second all-pass networks A1 and A2 are connected, respectively, to the subtrahend input and the minuend input of a subtracter sb1, which delivers the digital output signal sr of the receiver filter F2.

Figure 9:
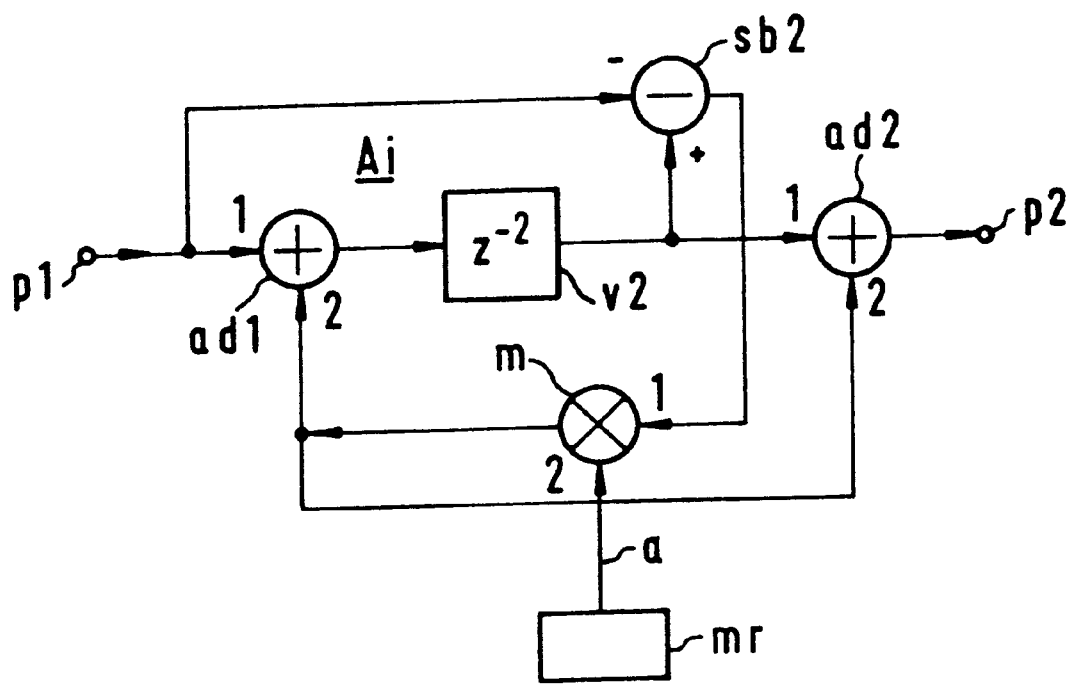
FIG. 9 shows an all-pass filter structure.

FIG. 9 shows the functional units and the structure of an all-pass filter Ai suitable for the invention in a block diagram. An input p1 is connected to the first input 1 of a first adder ad1 and to the subtrahend input of a subtracter sb2. The output of the adder ad1 is coupled to a $z^{-2}$ delay element v2 whose output is connected to the minuend input of the subtracter sb2 and to the first input 1 of a second adder ad2. Connected to the output of the subtracter sb2 is the first input 1 of a multiplier m, whose second input 2 is fed with a factor a from a memory device mr. With the factor a, the filter characteristics of the all-pass filter A1 are determined. The output of the multiplier m is connected both to a second input 2 of the first adder ad1 and to a second input 2 of the second adder ad2, whose output is connected to an output p2. The filter structure is thus very simple and can be easily implemented in digital form. It should be noted that the all-pass structure of FIG. 9 includes only a single multiplier m. By contrast conventional FIR structures for the receiver filter F2 include a plurality of multipliers with which individual weights are assigned to the stored signals. As many as 40 sample values may have to be weighted, and thus multiplied. The advantage of a receiver implementation using all-pass filters is readily apparent from this comparison. The receiver filter F2 or the transmitter filter F1 need not necessarily be implemented in digital form, but the inventive concept can also be applied in principle to analog filter structures.

We claim:

1. An asymmetric filter combination (F1, F2) for the transmission of a binary data stream (st) between a transmitter (T) and a receiver (R), comprising:

a first filter (FI) at the transmitter end having an FIR structure; and a second filter (F2) at the receiver end having an IIR structure, with the combination of the first and second filters (F1, F2) yielding a common transfer function $H_g(z) = Ht(z) \times H_r(z)$ which satisfies both the Nyquist criterion $H_g(z) + H_g(-z^*) = 1$ and the noise-matching criterion $H_t(z) = H_r(z^*)$.

2. A filter combination as claimed in claim 1, characterized in that the second filter (F2) comprises a first all-pass network ($A_1$) and a second all-pass network ($A_2$), with the transfer function $H_{all-pass}(z)$ of the first and second all-pass networks being defined by the relationship $$H_{all-pass}(z) = A_i(z) = (a_m + a_{m-1} \times z^{-1} + \ldots + z^{-m})/(1 + a_1 \times z^{-1} + \ldots + a_m \times z^{-m})$$

and the transfer function $H_r(z)$ of the second filter (F2) being defined by the relationship $$H_r(z)=(A_1(z^2)+z^{-1}\times A_2(z^2))\times \tfrac{1}{2}.$$

3. A filter combination as claimed in claim 1 or 2, characterized in that the transfer function $H_1(z)$ of the first filter (F1) is determined from the transfer function $H_r(z)$ of the second filter (F2), particularly via the symmetry condition of the noise-matching criterion $H_t(z)=H_r(z^*)$ with respect to the impulse responses $h_t(t)$, $h_r(t)$ of the first and second filters (F1, F2), and that the resulting impulse response $h_t(t)$ of the first filter (F1) is approximated with arbitrary accuracy by an FIR structure.

4. A filter combination as claimed in claim 2 or 3, characterized in that the second filter (F2) has two parallel signal paths which are connected together at the input end, and which are connected together at the output end by means of an adder/subtracter (sb1), with the subtrahend path containing the first all-pass network (A1), and the minuend path containing a series combination of a $z^{-1}$ delay element (v1) and the second all-pass network (A2).

5. A filter combination as claimed in any one of claims 2 to 4, characterized in that the first and second all-pass networks (A1, A2) each represent a first-order all-pass structure $A_i((z^2)$ which contains a $z^{-2}$ delay element (v2), a multiplier (m), a first adder (ad1), a second adder (ad2), and a second subtracter (sb2) as functional units.

6. A filter combination as claimed in claim 5, characterized in that the functional units in the all-pass structure $A_i(z^2)$ are interconnected as follows:

A series combination between an input (p1) and an output (p2) contains, in the direction of signal flow, the first adder (ad1), which is connected to the input (p1), as well as the $z^{-2}$ delay element (v2) and the second adder (ad2), which is connected to the output (p2);

the second subtracter (sb2) is connected to the input terminal (p1) via its subtrahend input, to the output of the $z^{-2}$ delay element (v2) via its minuend input, and to the first input (1) of the multiplier (m) via its output; and the second input (2) of the multiplier (m) is fed with a filter factor a from a memory (mr), and the output of the multiplier (m) is connected both to the second input (2) of the first adder (ad1) and to the second input (2) of the second adder (ad2).

7. A method of designing an asymmetric filter combination (F1, F2) for the transmission of a binary data stream from a transmitter (T) to a receiver (R), said filter combination comprising a first filter (F1) with an FIR structure at the transmitter end and a second filter (F2) with an IIR structure at the receiver end, wherein:

in a first step, the second filter (F2) is designed according to the transfer function $H_r(z)=(A_1(z^*)+z^{-i}\times A_2(z^2))/2$ using a $z^{-1}$ delay element (v1) as well as a first all-pass network (A1) and a second all-pass network (A2) whose respective transfer functions $A_i(z)$ are defined by the following relationship:

$$H_{all\text{-}pass}(z)=A_i(z)=(a_m+a_{m-1}\times z^{-1}+\ldots+z^{-m})/(1+a_1\times z^{-1}+\ldots+a_m\times z^{-m});$$

in a second step, the impulse response $h_r(t)$ of the second filter (F2) is determined;

in a third step, a mirrored impulse response $h'_r(-t)=h_t(t)$ is formed from the impulse response $h_r(t)$ of the second filter (F2) according to the noise-matching criterion $(H_t(z)=H_r(z^*)$, with the impulse response $h_r(t)$ being previously bounded in time in the range of slight residual oscillations, particularly in the range of residual oscillations which are dying out; and in a fourth step, the coefficients ($a_0$ to $a_n$) of an FIR filter which serves as the first filter (F1) in the filter combination (F1, F2) is determined from the mirrored and bounded impulse response $h_t(t)$.

\* \* \* \* \*